United States Patent [19]

Ravizza

[11] 4,106,065
[45] Aug. 8, 1978

[54] DRIVE CIRCUITRY FOR CONTROLLING MOVABLE VIDEO HEAD

[75] Inventor: Raymond Francis Ravizza, Cupertino, Calif.

[73] Assignee: Ampex Corporation, Redwood City, Calif.

[21] Appl. No.: 677,828

[22] Filed: Apr. 16, 1976

Related U.S. Application Data

[63] Continuation-in-part of Ser. No. 668,581, Mar. 19, 1976, abandoned.

[51] Int. Cl.² ............... G11B 5/52; G11B 21/10; G11B 21/18
[52] U.S. Cl. .................. 360/109; 360/77; 360/107; 360/330
[58] Field of Search ............. 360/77, 75–76, 360/84, 90, 130, 128, 113, 107, 109; 310/26, 8, 8.5, 9, 9.1, 9.6, 317, 326–327, 330–332, 368

[56] References Cited

U.S. PATENT DOCUMENTS 3,787,616  1/1974  Falk et al. .................. 360/75

FOREIGN PATENT DOCUMENTS 387,423  6/1973  U.S.S.R. .................. 360/75

OTHER PUBLICATIONS

Charles Edmiston, Piezoelectric Ceramic Transducers, Electronic Design, Sept. 1, 1974, pp. 78–82.

Primary Examiner—Alfred H. Eddleman

[57] ABSTRACT

Improved deflection of a bimorph having a pair of electrically poled piezo-ceramic elements bonded to opposite sides of a common substrate is achieved by applying to each element a deflection voltage whose polarity is always in the poling direction of the element to which it is applied. By maintaining the polarity of the deflection voltages in the poling direction of the piezo-ceramic elements, large amplitude deflection voltages can be used without de-polarizing the piezo-ceramic elements.

17 Claims, 13 Drawing Figures

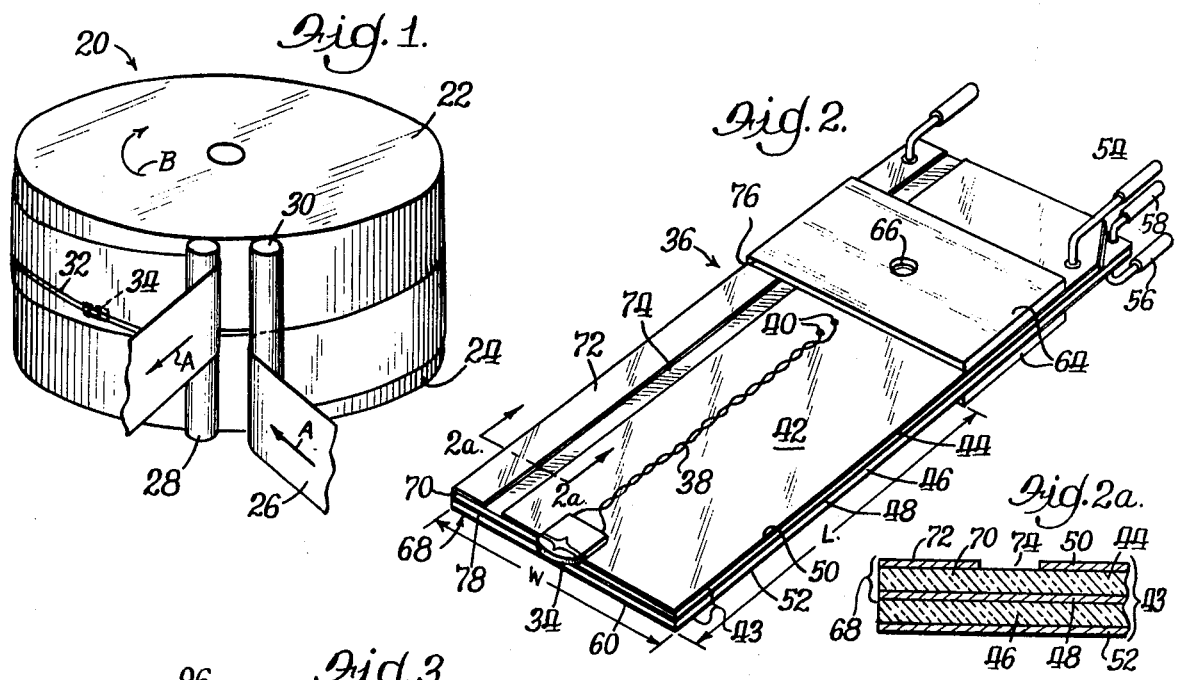

UP DEFLECTION (PRIOR ART)   NO DEFLECTION (PRIOR ART)   DOWN DEFLECTION (PRIOR ART)

UP DEFLECTION   NO DEFLECTION   DOWN DEFLECTION

DRIVE CIRCUITRY FOR CONTROLLING MOVABLE VIDEO HEAD

This application is a continuation-in-part of application Ser. No. 668,581 filed Mar. 19, 1976, now abandoned, This invention is directed generally to piezoelectric benders or bimorphs and is particularly directed toward bimorphs for use in systems requiring relatively large amounts of bidirectional deflection or bending.

It is known in the art to bond together a pair of piezoceramic elements and to apply a deflection voltage to the elements to cause them to bend or deflect along a lengthwise direction. This arrangement is known in the art as a bimorph or bender and, when such a bimorph is deflected electrically, it is said to be acting as a motor.

The individual ceramic elements which make up the bimorph are comprised of a high dielectric constant polycrystalline material. The material acquires piezoelectric properties by being subjected to a strong unidirectional voltage which polarizes the material according to the polarity of the applied voltage. Thus, the polarized material is said to have a "poling direction" and exhibits unique mechanical properties when subjected to subsequent voltages applied to it. For example, if a long thin piezoelectric element has its top surface free to move and its bottom surface restricted from movement, as by being bonded to a thin dimensionally stable substrate, and if a voltage is applied between the top and bottom surfaces, the element will bend.

A known method of multiplying the bending effect is to bond a piezo-ceramic element to each side of the substrate and to apply a voltage between the substrate and each element such that the voltage is in the poling direction of one element and opposed to the poling direction of the other element. A push-pull effect is achieved which causes the bonded pair of elements to bend to a greater degree than a single element. Reversing the polarity of the applied voltage reverses the direction in which the elements bend.

For some applications, the arrangement described above wherein a deflecting voltage is applied in the poling direction of one element and opposite to the poling direction of the second element is satisfactory. However, where a large amount of bending is required, large deflection voltages are also required. It has been found that applying large voltages in a direction opposed to the poling direction of a piezo-ceramic element (i.e., of a polarity opposite to that of the original polarizing voltage) tends to depolarize an element and reduces its ability to bend or deflect.

An example of an application where large bidirectional deflections are required is in a videotape recorder wherein information on a videotape is sensed by a "read" transducer mounted on a video head. Normally, the information on the tape is contained in "tracks" in the tape and, for the best reproduction of the information contained in the track, the read transducer must be centered on the track being "read". Modern videotape recorders include electronic means for sensing the position of the head relative to the track and for aligning the read transducer with the track. An example of such a videotape recorder is disclosed and commonly assigned in co-pending application by Raymond Francis Ravizza and James Ronald Wheeler, Serial No. 669,047, entitled AUTOMATIC SCAN TRACKING, filed on Mar. 22, 1976 and by Richard Allen Hathaway, Ser. No. 668,651, entitled POSITIONABLE TRANSDUCER MOUNTING STRUCTURE, filed on Mar. 19, 1976.

In one embodiment of the videotape recorder described in said application, a read transducer is mounted at one end of a bimorph. The deflection voltages are applied to the bimorph for deflecting it so as to position the read transducer properly with respect to the track being read.

The deflection required to move a read transducer in such a videotape recorder may be about 17 mils or more, depending upon the design limits of the apparatus, as discussed therein. In such cases, large deflection voltages must be applied to the bimorph. If the bimorph is constructed and driven according to prior art methods, reduced deflection sensitivity results because of the depolarizing effect described above. This depolarizing effect is a distinct disadvantage in the environment of a videotape recorder and in other applications where reduced deflection sensitivity is undesirable.

Accordingly, it is a general object of this invention to provide an improved method for driving a bimorph.

It is a more specific object of this invention to provide apparatus and method for driving a bimorph so as to deflect it bidirectionally with large amplitude deflection signals without depolarizing the bimorph.

It is another object of this invention to provide an improved deflectable read transducer system for use in a videotape recorder for deflecting a bimorph-supported transducer.

Other objects and advantages of the present invention will become apparent upon reading the following detailed description, while referring to the attached drawings, in which:

FIG. 1 is a perspective view of a portion of a helical videotape recorder, simplified for the sake of clarity, particularly illustrating a rotatable sensing drum and read head;

FIG. 2 is a perspective view of a read transducer assembly for use with the read head of FIG. 1;

FIG. 2a is an enlarged cross-section of a portion of the transducer assembly shown in FIG. 2, and illustrating the layered construction of the assembly;

FIG. 3 is a block diagram of a feedback control system for controlling vibrations in a bimorph read transducer assembly;

Figure 5:
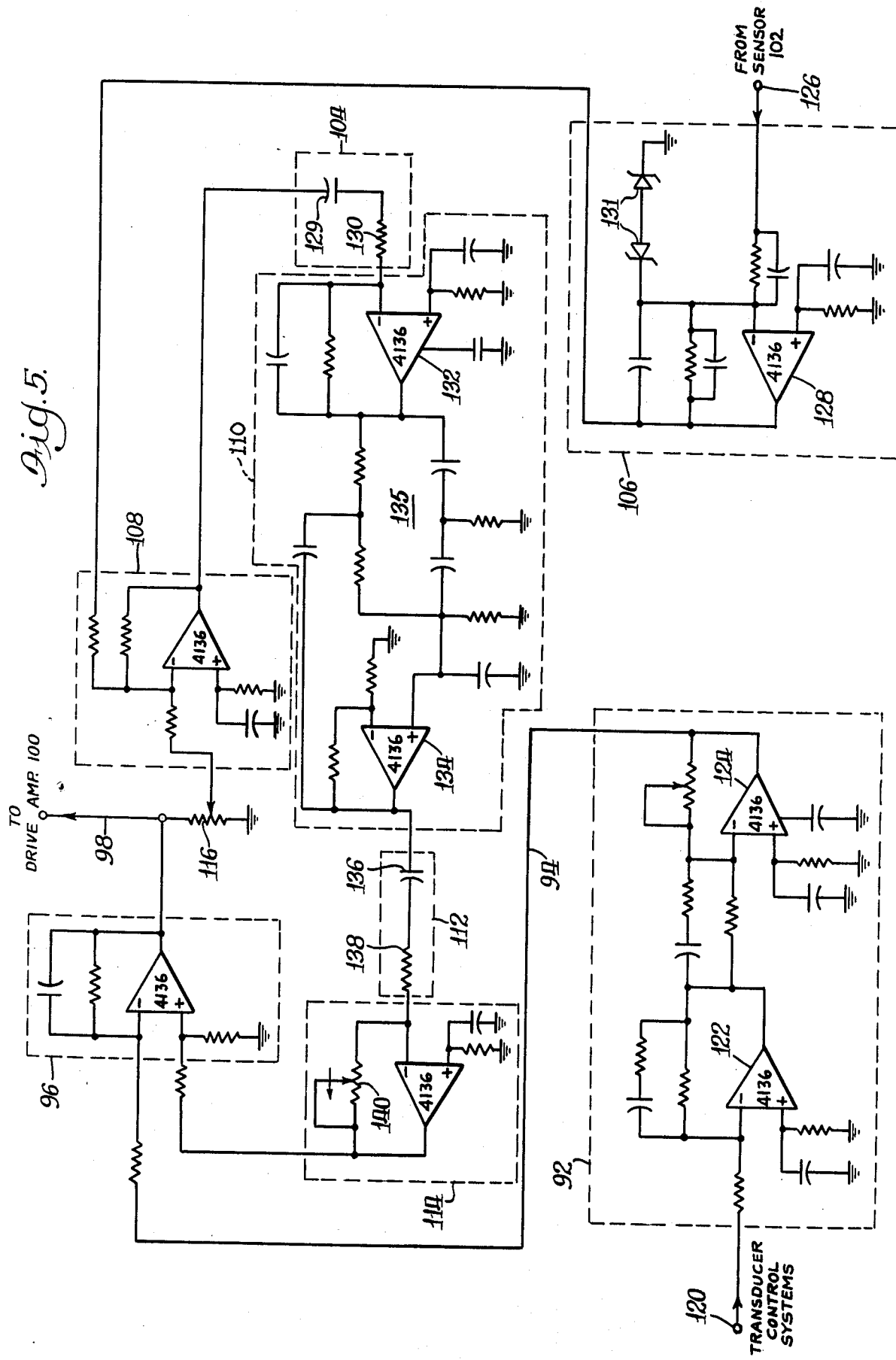
Figure 6:
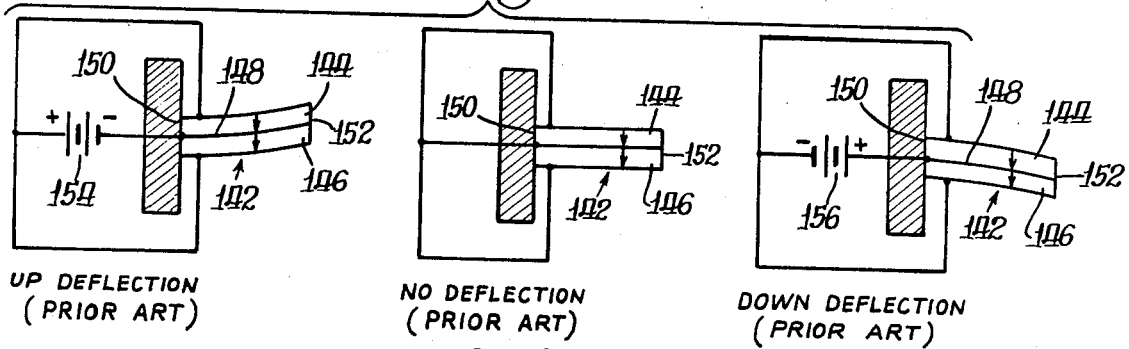
Figure 7:
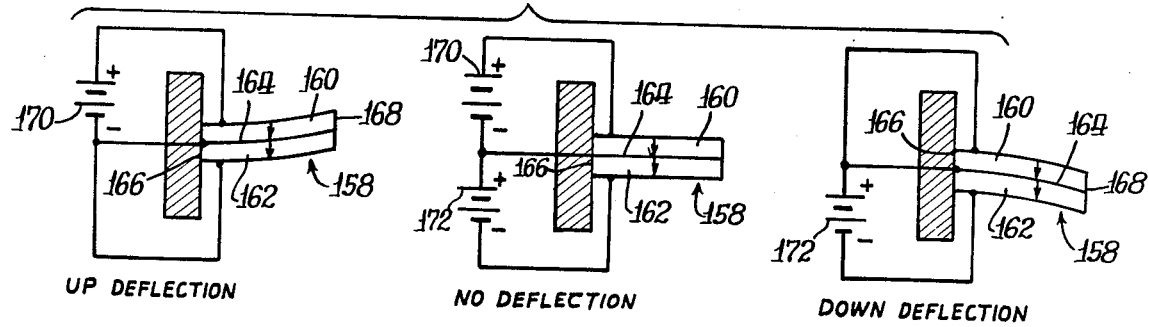
Figure 8A:
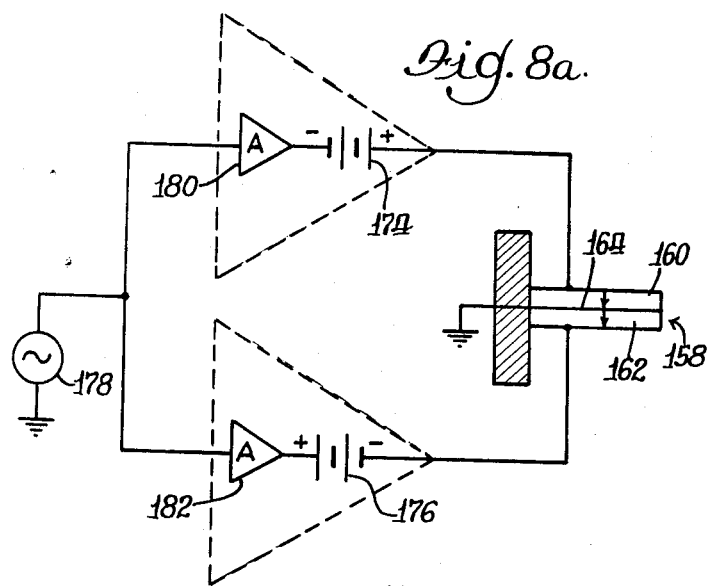
Figure 8B:
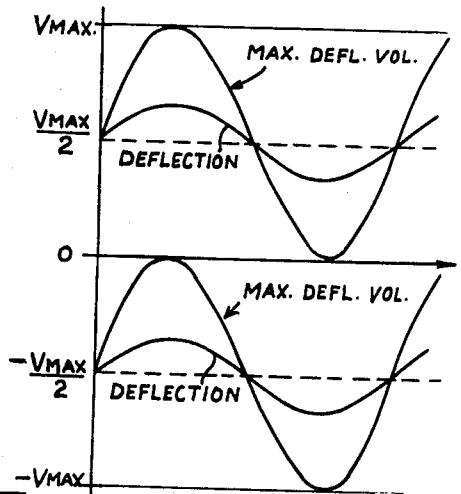
Figure 9:
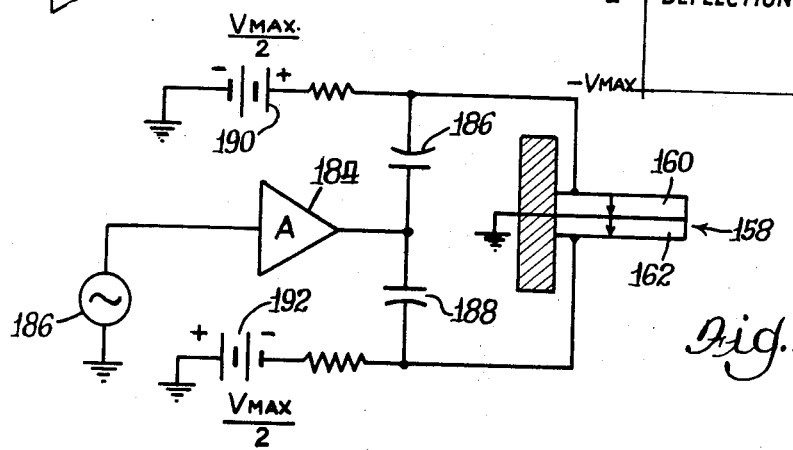
Figure 10:
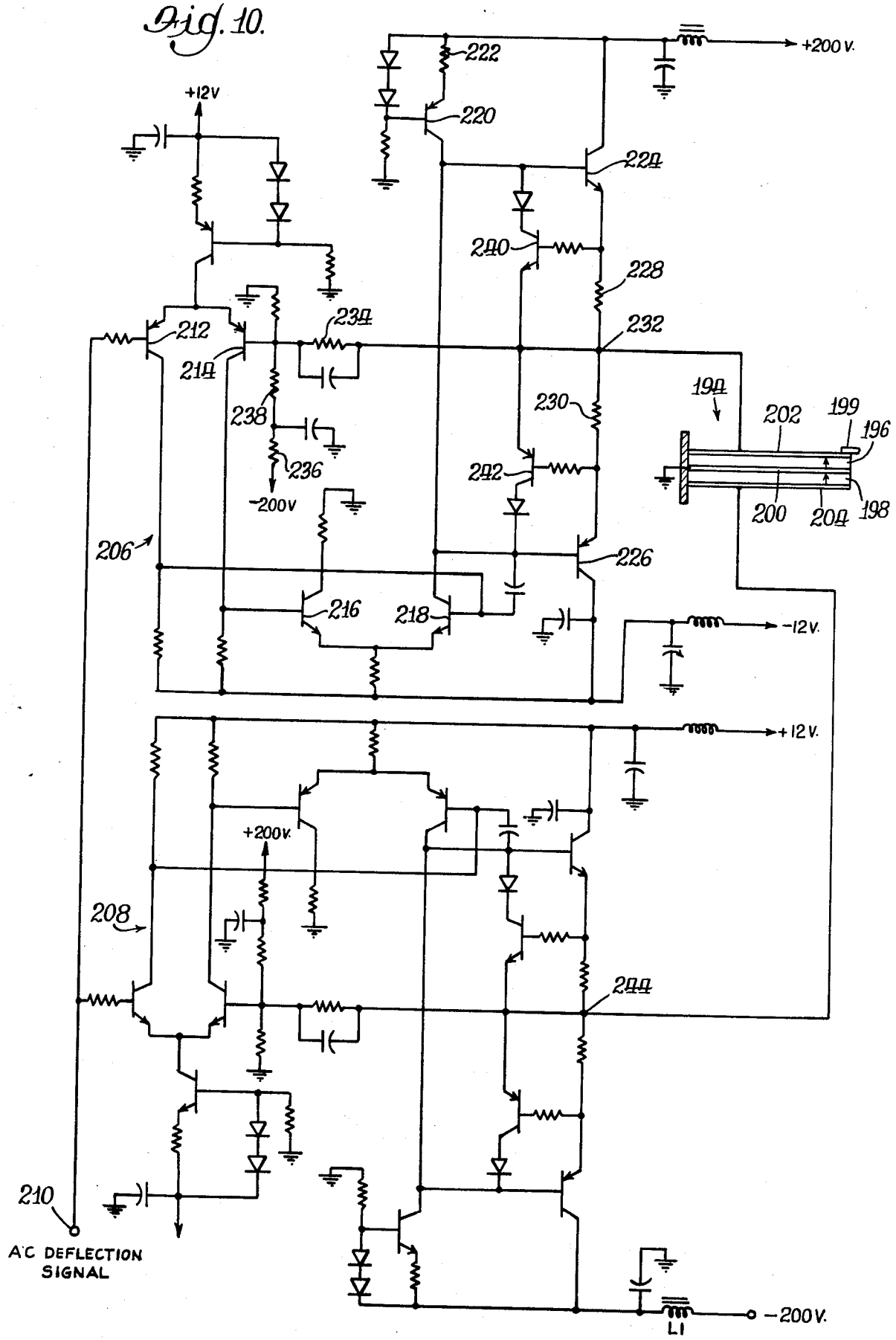

FIGS. 4a and 4b graphically illustrate the frequency and phase response to the bimorph transducer assembly used in the control system of FIG. 3;

FIG. 5 is a schematic diagram of the control system illustrated in FIG. 3;

FIG. 6 shows prior art methods of deflecting a bimorph;

FIG. 7 illustrates an improved method of deflecting a bimorph embodying various aspect of this invention;

FIG. 8a illustrates an improved method of varying the direction and magnitude of deflection of a bimorph and embodies further aspects of this invention;

FIG. 8b graphically illustrates the net voltage which is applied to the elements of the bimorph shown in FIG. 8a;

FIG. 9 shows an improved method of driving a bimorph in accordance with this invention when the bimorph deflection signal does not include very low frequency or DC components;

FIG. 10 is a schematic diagram of a deflectable read transducer system embodying the improved bimorph deflection method illustrated in FIG. 8a.

Broadly stated, the present invention is directed to a method and apparatus for reliably providing large amplitude deflection of deflectable bimorphs or benders and achieving such large amplitude deflection without experiencing undesirable depolarization which has typically resulted in the past. The present invention avoids such undesirable depolarization by applying to a bonded pair of piezo-ceramic elements aligned in a common poling direction, deflection voltages whose polarities are in the poling direction of the element to which they are applied. In one embodiment of this invention, a DC bias voltage is applied to each ceramic element such that the applied voltage is in the poling direction of the element to which it is applied. An AC deflection voltage is superposed on the DC bias voltage for controlling the deflection of the bimorph. The magnitude of the bias voltage is chosen to insure that the net voltage applied to an element has a polarity in the poling direction of that element.

It should be apparent from the following description that this invention is useful in a variety of applications and is particularly useful in the environment of a helical videotape recorder. Accordingly, while the embodiments of the invention specifically shown and described herein are in conjunction with helical videotape recorders, it should be understood that the scope of the invention should not be limited to such helical recorders.

To more clearly describe this invention and its cooperation with other inventions which find use in helical videotape recorders, this description will cover not only embodiments of this invention but also embodiments of other inventions not claimed herein. The inventions described but not claimed herein are claimed in commonly assigned co-pending Applications by David Edward Brown, Ser. No. 668,653, entitled TRANSDUCER ASSEMBLY VIBRATION SENSOR, and by Rayond Francis Ravizza, Ser. No. 668,580, entitled SYSTEM FOR DAMPING VIBRATIONS IN A DEFLECTABLE TRANSDUCER, filed on Mar. 19, 1976. As has been pointed out above, some of the embodiments described herein relate to helical videotape recorders. They are particularly related to apparatus and methods for controlling the alignment of a read transducer with respect to tracks on a videotape. Therefore, a brief description of the operation of a videotape recorder read transducer will first be given.

Referring to the drawings, and particularly FIG. 1, a scanning drum 20 of a helical videotape recorder is shown and has a rotatable portion which carries a reproducing or "read" head which contacts and scans successive tracks on a magnetic videotape.

The scanning drum 20 has a pair of drum portions 22 and 24 around which a videotape 26 is wrapped. The tape 26 is caused to move by tape transport means (not shown) in the direction of the arrows A and wraps around the drum portions 22 and 24 in a helical path. The tape 26 is kept in tight contact and alignment with the drums by guide rollers 28 and 30 and by tension exerted on the tape by the tape transport.

In a helical videotape recorder the information tracks run diagonally with respect to the lengthwise dimension of the tape, and a portion of one such track 32 whose size is exaggerated for clarity is shown in FIG. 1. In order to sense the information recorded on track 32 a read transducing head 34 is mounted on drum portion 22 which rotates in the direction of the arrow B. The movement of the tape 26 and the rotation of the transducer 34 causes transducer 34 to contact the tape along the track 32 and to generate an electrical signal representative of the information previously recorded on the track. This electrical signal is fed to signal processing circuitry for processing in a manner well known in the art.

It is apparent that the extent to which the transducer 34 can faithfully reproduce the information originally recorded on the track 32 depends on the transducer 34 accurately following or tracking the track 32. Tracking problems arise, for example, when videotapes or the tracks become distorted, as by temperature or humidity induced dimensional changes in the tape, or by faulty tensioning mechanisms in the tape transport, for example.

Because of such tracking problems, it is desirable to sense the instantaneous position of transducer 34 with respect to track 32. Apparatus for sensing the position of a read transducer with respect to a track is disclosed and claimed in co-pending Applications by Richard Allen Hathaway, Ser. No. 668,571, entitled AUTOMATIC SCAN TRACKING, and the aforementioned Ravizza et al application Ser. No. 669,047, and Hathaway application, Ser. No. 668,651. Briefly, when perfect tracking between the read transducer and the track is not occurring, an electrical correction signal is applied to a deflectable support art such as a bimorph on which the read transducing head is mounted. The correction signal causes the support arm to deflect the transducer toward track center and thus reduces tracking errors.

Deflection of the read transducer is also desirable in helical videotape recorders such as that described in co-pending application by Richard Allen Hathaway et al, Ser. No. 668,652, entitled METHOD AND APPARATUS FOR PRODUCING SPECIAL MOTION EFFECTS IN VIDEO RECORDING AND REPRODUCING APPARATUS, filed on Mar. 19, 1976, wherein slow motion and other effects in a reproduced video scene are generated, the approximately half speed slow motion effect, for example, being produced by reducing the tape transport speed to one-half its normal speed and by causing the read transducer to read each track twice. In order to read a track twice, the read transducer must be physically re-positioned or reset to the beginning of the track which is to be repeated. This reset of the read transducer is accomplished in one embodiment of the recorder disclosed in the above-noted Application by applying an electrical reset signal to the deflectable support arm upon which the read transducer is mounted and thereby deflecting the support arm and the transducer so as to reset the transducer to the beginning of the desired track. The reset signal is in the form of an electrical impulse which may tend to cause the support arm to vibrate or oscillate, and such vibrations must be damped to assure correct alignment between the transducer and the tape.

Vibrations in the deflectable transducer support arm are also induced when the transducer makes and loses contact with the tape. For example, in the scanning drum arrangement of FIG. 1, read transducer 34 experiences a dropout because it loses contact with tape 26 in the gap between guide rollers 28 and 30 during each rotation of the drum 20. Contact between the transducer 34 and the tape 26 is re-established as transducer 34 passes roller 28 as it rotates in the direction of arrow B.

The vibrations set up in a deflectable transducer support arm are, of course, undesirable since they can produce a loss of tracking. This loss of tracking due to vibrations can be minimized or eliminated by sensing the vibrations in the deflectable support arm and applying a damping signal to the support arm to counteract the vibrations.

Thus, in helical videotape recorders in which it is desirable to include a deflectable support arm for reducing tracking errors, it is also desirable to include means for damping electrically and mechanically induced vibrations in the deflectable support arm. Preferably, damping the vibrations can be done electronically, in which case some means for sensing the amplitude of the vibrations and for generating an electrical signal indicative thereof, is required.

A deflectable read transducer assembly which includes means for sensing vibrations induced therein is shown in FIG. 2 and is indicated generally by reference numeral 36.

At one end of assembly 36 is the read transducer 34 itself. Its output is coupled via wires 38 to a pair of transducer output terminals 40 from which the transducer output is fed via line 82 to a conventional video processing circuit 84.

A support arm, indicated generally at 42, for holding and deflecting transducer 34 is a piezoelectric bimorph which deflects or bends when a deflection potential is applied to it. The bimorph is formed from a number of layers bonded together to act as a piezoelectric motor 43 and includes a top piezo-ceramic element or layer 44 and a bottom piezo-ceramic element or layer 46. The various layers of transducer assembly 36 are shown more clearly in FIG. 2a. Piezo-ceramic elements 44 and 46 are both bonded to a common, electrically conductive substrate 48. Substrate 48 limits the movement of the bimorph to a bending motion in response to an applied electrical potential.

In order to impress an electrical potential to piezo-ceramic elements 44 and 46, conductive layers 50 and 52 cover the outer surfaces of elements 44 and 46. Terminals 54 and 56 (FIG. 2) are electrically connected to layers 50 and 52, respectively, for receiving an electrical deflection potential. Substrate 48 also has an input terminal 58 to serve as electrical common for the applied deflection potential. The electrical potential for deflecting support arm 42 is applied across piezo-ceramic element 44 between terminals 54 and 58 and across piezo-ceramic element 46 between terminals 56 and 58.

In order to force support arm 42 to deflect at its free end 60 where transducer 34 is mounted, arm 42 is cantilevered between insulating spacers 64 which may be held in place by a bolt (not shown) passing through hole 66.

In operation, appropriate deflection potentials are applied across piezo-ceramic elements 44 and 46 via input terminals 54, 56 and 58. Support arm 42 then bends at its free end 60 and deflects transducer 34 in a direction and to an extent which is dependent on the magnitude and polarity of the potentials applied to terminals 54, 56 and 58.

In some applications, a piezoelectric motor need include only one piezo-ceramic element bonded to a substrate. For example, a single piezo-ceramic element could have a top surface covered by a conductive layer and a bottom surface bonded to a conductive substrate which forces the element to bend when an electric potential is applied between the substrate and conductive layer. However, where large amounts of deflection are required, such as in videotape transducers, a motor element comprising two piezo-ceramic elements 44 and 46, as shown in FIG. 2, is preferable.

In addition to having a piezoelectric motor 43 for deflecting transducer 34, the assembly 36 also includes a deflection or vibration sensor in the form of a piezoelectric generator 68. The generator 68 includes, in the illustrated embodiment, an edge portion 70 of the piezo-ceramic element 44 whose bottom surface is bonded to substrate 48 as previously described. It should be appreciated, however, the generator 68 could be formed by a portion located in the center of the element 44. The generator has a separate conductive layer 72 overlying the element portions 70. The conductive layer 72 is isolated from conductive layer 50 by a dielectric gap 74 to electrically isolate the output of generator 68 from potential applied to the conductive layer 50.

The generator 68 is cantilevered at 76 and has an opposite, free deflectable end 78. Thus, whenever vibrations or deflections occur in the motor 43 due to electrical or mechanical impulses, a corresponding deflection or vibration of the free end 78 of generator element 68 occurs and produces, between the common substrate 48 and the conductive layer 72, an electrical signal indicative of the instantaneous degree of deflection of the motor 43 and of the transducer 34.

In the description of the piezoelectric motor and generator above, generator 68 was said to include a piezo-ceramic element portion 70 of the element 44 and the motor 43 includes the bulk of the piezo-ceramic element 44. As shown in FIGS. 2 and 2a, piezo-ceramic element portion 70 is preferably part of the unitary piezo-ceramic layer or element 44. However, it is not necessary that the portion 70 be part of a larger unitary piece. For example, gap 74 could be extended downwardly to cut through layer 44 and form a separate element 70. It has been found, however, that even with large amplitude deflection signals applied to the elements 44 and 46, these deflection signals are not substantially coupled to generator 68 when the element portion 70 is part of the larger unitary element 44. However, cutting the element down to the ground plane results in an increased isolation of the motor-to-generator and increases the element's tolerance to surface contamination.

Any vibration sensor which develops an electrical output indicative of vibrations in arm 42 should be responsive to vibrations over a frequency range extending from approximately 10 Hertz up to at least 400 Hertz, at which the illustrated bimorph support arm has a resonant frequency. The generator 68 of FIG. 2, by extending lengthwise along the support arm 42, does exhibit a good frequency response over the range desired. This response appears much better, particularly at low frequencies, than the frequency response of a generator which may extend transverse to the lengthwise dimension of the support arm 42.

The preferred dimensions for support arm 42 include a length L extending from free end 60 to the cantilevered point 76 of approximately 0.9 inch and a width W of approximately 0.5 inch. Each of the layers 44, 46 and 48 are preferably approximately 0.006 inch thick while conductive layers 50, 52, and 72 have thicknesses in the range of a few microns. The width of the conductive layer 72, as measured between the gap 74 and the nearest edge of the support arm 36, is preferably about 50 mils. The substrate 48 is preferably made of brass and the conductive layers 50, 52 and 72 are nickel depositions. The piezo-ceramic layers 44 and 46 are bonded to substrate 48 by an epoxy adhesive or the like.

The read transducer assembly 36 may be enclosed in a housing (not shown) having top and bottom portions which hold assembly 36 between them. The entire housed assembly may be held together by a bolt passing through appropriate holes in a top portion of the housing, through hole 66 (FIG. 2), and through another hole in a bottom portion of the housing. A more detailed description of a housing which may be used for assembly 36 is given in the aforementioned Richard Allen Hathaway application, Ser. No. 668,651, the pertinent teachings of which are incorporated by reference herein.

The piezoelectric motor-generator combination described above is a low cost, reliable device capable of being controllably deflected and for simultaneously generating an output signal representative of the controlled deflection or of vibration-induced deflection. It is particularly useful as part of a read transducer assembly for a videotape recorder and is illustrated schematically in connection with the videotape recorder systems described below.

The piezoelectric motor-generator combination described above which simultaneously deflects a read transducer and senses vibrations therein is used in an electronic feedback control system for damping vibrations in a videotape read transducer.

There have been transducer damping schemes which have used so-called dead rubber pads to absorb vibrations in a transducer but the pads also limit the effective deflection range of the transducer. If the pads are mounted on the read head adjacent the transducer in a rotatable scanning drive, they are subjected to high G forces as the drum rotates. Under these conditions, it can be difficult to keep the pads properly situated on the drum. An improved damping system in which the above-described motor-generator combination can be used is shown schematically in FIG. 3. Before describing the improved damping system, however, a brief description of associated transducer circuitry will be given in order to clearly indicate how the damping system cooperates with the associated circuitry.

Referring now to FIG. 3, a read transducer 34 operates as described above to sense or read previously recorded information in videotape tracks. The transducer 34 is part of the read transducer assembly 36 such as that shown in FIG. 2 and has a deflectable support arm 42 for deflecting transducer 34 in response to deflection signals to correct the alignment of transducer 34 with a track or to reset transducer 34 to the beginning of a track, as in the slow motion mode of operation described above. The support arm 42 is cantilevered at point 76 and its opposite end portion which supports transducer 34 is free to deflect.

The electrical signal output of transducer 34 appears on conductor 82 which conducts this signal to conventional video processing circuitry 84 for generating, for example, a composite television signal for RF transmission.

The output of transducer 34 is also fed to a transducer position control circuit 86. The function of control circuit 86 is described in detail in the aforementioned copending U.S. Application by Ravizza et al, Ser. No. 669,047, and by Hathaway, Ser. No. 668,651, and is not a part of the present invention. Briefly, however, they describe a position control circuit 86 which generates a "dither" signal of fixed frequency for application to the deflectable support arm 42 for deflecting or "dithering" transducer 34 back-and-forth across a track at a fixed rate. Since dithering causes the transducer 34 to move transversely relative to the track, the signal output of transducer 34 will be amplitude modulated at the dither frequency. The amplitude modulated signal envelope contains information concerning the alignment between transducer 34 and the track being read and is detected to produce a correction signal for moving the transducer 34 toward the center of the track. This correction signal and the dither signal appear on conductor 88 and are ultimately applied to the deflectable support arm 42.

A transducer reset signal generator 90 develops an electrical signal for application to the deflectable support arm 42 for selectively resetting the transducer 34 to the beginning of a track when such is required. Circuitry for developing such reset signals is described and claimed in co-pending Hathaway application, Ser. No. 668,652.

The reset signal from signal generator 90 and the dither correction signal from circuit 86 are both fed to a frequency compensator 92 which comprises an amplifier whose frequency response complements the undesired residual response variations of support arm 42 when electronic feedback control damping is applied to it as shown schematically in FIG. 3. Frequency compensator 92 augments the action of the electronic damping circuit in order to provide the desired uniform frequency response for the overall system. The area of augmentation is in the 300 to 400 Hz region where the electronic damping action does not completely remove the rise in frequency response of arm 42 at its first-order mechanical resonant frequency.

The frequency compensated deflection signals from compensator 92 are fed via conductor 94 to a summing amplifier 96 which sums the deflection signals with a transducer damping signal generated by the feedback loop described below. The output of the summing amplifier 96 is fed via conductor 98 to a drive amplifier 100 which amplifies its input and applies it to deflectable support arm 42 for controllably deflecting transducer 34 to the center of the track and maintaining proper transducer to track alignment.

The various deflection signals which are applied to the support arm 42, particularly signals generated by the reset generator 90, may set up unwanted vibrations in the arm 42. This is particularly true where the arm 42 is a bimorph since bimorphs exhibit resonance characteristics which tend to drive the bimorph into damped oscillation.

To damp such oscillations, a negative feedback loop is included in the system shown in FIG. 3 for developing an electrical damping signal and for applying the damping signal to support arm 42 to dampen its vibrations or oscillations. The required damping signal is derived, in general, from a signal generator which generates a deflection velocity signal representative of the instantaneous deflection velocity of the read transducer 34. In the embodiment illustrated in FIG. 3, said signal generator includes a sensor 102 integral to the support arm 42 for generating a signal representative of the instantaneous deflected position of the transducer 34 and a differentiator 104 for converting the transducer position signal to a transducer velocity signal. The sensor 102 is preferably a piezoelectric generator of the type shown in FIG. 2 which is integrally formed with the bimorph support arm.

The output of sensor 102 is fed to a high input impedance amplifier 106 which presents a very small load to the sensor 102. Since the sensor 102 is typically equivalent to a voltage source in series with a capacitance, any electrical load on sensor 102 must be small in order to effectively couple low frequency signals from the sensor 102.

The output of amplifier 106 is coupled through a summer 108, whose other input will be described below, and to the differentiator 104 which differentiates the transducer position signal from the sensor 102 and converts it to a signal representative of instantaneous transducer velocity.

The differentiator 104 is illustrated as having an amplitude versus frequency characteristic similar to that of a high pass filter and therefore introduces a phase lead to the signals it passes. The significance of the phase shift experienced by a signal traversing the feedback loop is explained immediately below in order to better appreciate the function of the remaining undescribed elements of the feedback loop.

Because the support arm 42 is preferably a piezoelectric bimorph, it exhibits the well known first order resonance and anti-resonance characteristics of piezoelectric crystals, as well as higher order resonance characteristics. FIG. 4a illustrates the combined frequency response of a bimorph motor-generator combination of the type shown in FIG. 2. This response is generated by applying a varying frequency, constant amplitude sine wave to the piezoelectric motor and measuring the resultant output of the piezoelectric generator. The results of such a measurement are shown in FIG. 4a which indicates a resonance point near 400 Hertz and an anti-resonance point, which has been found to vary from around 700 Hertz to about 1000 Hertz, depending on the particular bimorph being used. The maximum output of the motor-generator combination occurs at resonance and the minimum output occurs at very low frequencies and at anti-resonance. High order resonance characteristics are not shown in FIG. 4a.

Since the output of the motor-generator combination is maximum at resonance, vibrations or oscillations will tend to occur at its resonant frequency when the bimorph is excited by an electrical or mechanical impulse. Therefore, to eliminate the possibility of such oscillations, the feedback loop is tailored to feed back to the bimorph damping signals which are 180° out of phase with respect to the signals which initially excited the bimorph into oscillation, thereby counteracting the tendency of the bimorph to oscillate.

To insure that the damping signals are of the correct phase, the phase response of the bimorph motor-generator combination must be taken into account. As indicated in FIG. 4b on the curve labeled "bimorph", signals near resonance (about 400 Hertz) experience a phase shift of about 90° in passing through the motor-generator combination, and high frequency signals experience a phase shift of 180°. In order to ensure that signals near resonance experience a net phase shift of 180° around the feedback loop, and since all signals in the loop will be phase shifted 180° by an inverting feedback amplifier prior to being applied to support arm 42, the signals near resonance must be phase compensated by 90° so that their net phase shift is zero at the input to the inverting feedback amplifier. This insures that the loop will not oscillate at the resonant frequency due to instability in the feedback system. Since signals having a frequency far from resonance have a very low amplitude, the loop gain of the feedback loop will always be less than unity for them so that the phase shift which they experience will not cause instability in the loop.

Returning to the feedback loop of FIG. 3, the transducer velocity signal developed by differentiator 104 is fed to a low pass filter 110 whose upper cutoff frequency is chosen to substantially attenuate signals attributable to second order and higher order resonance characteristics of the bimorph. Such signals generally have a frequency of over 2000 Hertz and are attenuated at least 20 decibels by the filter 110. The filter 110 contributes some phase lag to signals which it passes in addition to the initial phase lag of 90° due to the bimorph itself (as shown in FIG. 4b).

To compensate for the total phase lag experienced by signals near resonance, a phase lead network 112 follows filter 110 and shifts the phase of signals received from the filter 110 so that those signals having a frequency near resonance have net phase shift of zero degrees upon leaving the lead network 112. The curve labeled "with lead network" of FIG. 4b illustrates the effect of lead network 112. In practice, the differentiator 104 also adds some phase lead and thereby assists the lead network 112 in properly adjusting the phase of the signals near resonance.

The signals near resonance from lead network 112 have a pase of zero degrees with respect to the signals initially exciting the bimorph and are in condition to be applied to a negative feedback amplifier 114 which inverts the signals received from the lead network 112. The output of negative feedback amplifier 114 is the damping signal which is combined in the summer 96 with the transducer deflection signals from the conductor 94, amplified by the drive amplifier 100, and applied to the bimorph support arm 42 to damp vibrations therein. The feedback amplifier 114 has a variable amount of negative feedback for adjusting the gain of the feedback loop to accommodate differences among bimorphs.

The feedback loop illustrated in FIG. 3 also includes means for compensating for the different anti-resonance responses among bimorphs. A frequency response curve is shown by the solid line in FIG. 4a and a dashed line indicates the variable nature of the anti-resonance characteristic among various bimorphs. For example, at 700 Hertz the frequency response of one bimorph may be considerably less than that of another bimorph, as indicated by the difference between the solid line and the dashed line at the frequencyof 700 Hertz. Referring to FIG. 4b, the phase response to the feedback system with the lead network is such that signals near 700 Hertz undergo a 180° phase shift. If signals having a 180° phase shift are applied to inverting feedback amplifier 114, they will ultimately be applied to a deflectable support arm 42 in phase with the original exciting deflection signals and may lead to oscillations at that frequency if their amplitude is large enough at frequencies corresponding to positive feedback conditions for the feedback loop. Bimorphs having a frequency response illustrated by the solid curve of FIG. 4a have a very small output at 700 Hertz so that the overall loop gain of the system for such signals will be low enough to avoid oscillations, irrespective of their phase response. However, bimorphs exhibiting greater gain at 700 Hertz, as illustrated by the dashed line, may induce instability into the system if not otherwise compensated for. The feedback system illustrated in FIG. 3 compensates for such differences between bimorphs by adding a portion of the exciting deflection signals to the output of the sensing device 102 so that signals normally experiencing a 180° phase shift between their application to bimorph 42 and their output at sensor 102 will be effectively nulled. Signals experiencing such a 180° phase shift are shown by FIG. 4b to be in the vicinity of anti-resonance. Therefore, signals near anti-resonance can be effectively nulled by coupling across the transducer assembly 36 a portion of the signal normally fed thereto.

Referring to FIG. 3, a means for feeding through a portion of the deflection signal and combining it with the position signal developed by the sensor 102 includes the potentiometer 116 and the summer 108. Deflection signals appearing at the output of the summer 96 are fed to both the drive amplifier 100 and the potentiometer 116, whereupon a portion of the deflection signals are fed via conductor 118 to summer 108. Summer 108 also receives, from amplifier 106, deflection position signals developed by sensor 102. Deflection signals which undergo a 180° phase shift in passing through the input to support arm 42 to the output of sensor 102 (i.e. frequencies near anti-resonance) are nulled in summer 108 so that the loop is stabilized for frequencies near anti-resonance. This operation effectively creates an artificial null near 700 Hertz so that, regardless of the bimorph being used in transducer assembly 36, it will appear to have an effective null near 700 Hertz so that the loop gain for signals near 700 Hertz will always be less than unity and the feedback loop will be stabilized for signals at those frequencies.

Circuitry for effecting the functions of the various blocks in FIG. 3 is illustrated in FIG. 5. Transducer deflection signals, including the dither signal and reset signals referred to above, are applied at terminal 120 to frequency compensator 92 which includes a pair of conventional amplifiers 122 and 124. The frequency response of compensator 92 is shaped conventionally by the RC coupling around amplifier 122 and between amplifiers 122 and 124 to have an overall amplification which decreases with frequency in the 300 to 400 Hz region in order to compensate for the residual frequency-dependent variations in deflection sensitivity of support arm 42 after electronic damping has been applied.

The output of amplifier 124 is fed via conductor 94 to summing amplifier 96 which also receives, at its non-inverting input, an input from the feedback control loop. The output of summing amplifier 96 is applied to drive amplifier 100 via conductor 98.

The negative feedback loop begins at terminal 126 at which the output from sensor 102 appears. The signal from sensor 102 is applied to amplifier 106 which is a conventional, frequency compensated, feedback amplifier 128. The output of amplifier 128 is fed to the inverting terminal of summing amplifier 108 which also receives, at the same input, a portion of the transducer deflection signals for creating the artifical null at anti-resonance as described above. Diodes 131 protect amplifier 128 from damaging high voltage transients due to accidental short circuits between sensor 102 and the input to support arm 42.

The output of summing amplifier 108 is then conducted to differentiator 104, comprising serially connected capacitor 129 and resistor 130.

The low pass filter 110 which receives the output of differentiator 104 is an active elliptical filter comprised of amplifiers 132 and 134, and indicated generally at 136.

The lead network 112 receives the output of the filter 110 and comprises a capacitor 136 serially coupled to resistor 138. The output of the lead network 112 is applied to the inverting input of a conventional feedback amplifier 114 whose feedback and therefore forward gain is varied by adjusting the variable resistor 140. The output of amplifier 114 is coupled to the non-inverting input of summing amplifier 96 and then applied to the drive amplifier 100 which, in turn, drives the deflectable support arm 42 for deflecting the transducer 34 in the manner previously described.

The damping system described above provides improved damping for deflectable videotape transducers without restricting their dynamic range. The feedback control loop, in combination with the motor-generator transducer assembly, provides a reliable and low cost vibration damper for videotape recorders and other applications where vibrations in a deflectable bimorph transducer assembly require damping.

From the foregoing, it should be understood how a videotape read transducer can be controllably deflected and damped to maintain alignment between itself and a tape track. An improved bimorph transducer system, including a method of applying deflection signals to a deflectable bimorph to achieve maximum deflection sensitivity will now be described. Such an improved system is useful in the tape recorder apparatus already described and will be illustrated in that environment. It is understood, however, that the improved method of driving a deflectable bimorph disclosed below is also useful in other applications where it is desirable to achieve a large amount of bimorph deflection.

A bimorph which is used for bi-directional deflection consists generally of two layers of piezo-ceramic material bonded to opposite sides of a conductive substrate. One end of the bimorph is cantilevered and the opposite end is left free to deflect in response to a voltage applied to the bimorph.

The direction in which a bimorph deflects depends on the polarity of the voltage applied to it and the poling direction of the pair of piezo-ceramic elements. The poling direction of a piezo-ceramic element is established by being initially subjected to a unidirectional electric field which polarizes the element according to the direction of the field. The polarized piezo-ceramic element is then said to have a "poling direction" and thereafter exhibits unique mechanical properties when subjected to subsequently applied voltages.

A known method of causing a bimorph to deflect or bend is illustrated in FIG. 6 wherein a bimorph 142 includes piezo-ceramic elements 144 and 146 bonded to opposite sides of conductive substrate 148. Bimorph 142 is cantilevered at 150 while its opposite end 152 is free to deflect.

Piezo-ceramic elements 144 and 146 are each shown with an arrow to indicate their respective poling directions. When they are aligned as shown in FIG. 6 with their arrows pointing in the same direction, they are referred to herein as having a common poling direction.

The poling directions shown are obtained by applying a voltage across a piezo-ceramic element such that the more positive potential is at the tail of the arrow and the more negative potential is at the head of the arrow. For example, in FIG. 6, bimorph 142 is shown being deflected upwardly by a voltage source 154 connected between elements 144, 146 and substrate 148. The polarity of source 154 is such that it is applying a voltage to element 144 in the same direction as its original polarizing voltage, whereas source 154 is applying a voltage to element 146 of a polarity opposed to its original polarizing voltage. When the polarity of a deflection voltage applied to a piezo-ceramic element is identical to the polarity of that element's original polarizing voltage, the applied deflection voltage is referred to herein as being applied in the poling direction. Thus, source 154 is applied to element 144 in its poling direction and is applied to element 146 in a polarity opposed to its poling direction.

When pairs of piezo-ceramic elements are aligned and cantilevered as indicated in FIG. 6, the bimorph will bend in the direction of the element which is being driven in its poling direction. Thus, bimorph 142 bends upwardly toward element 144 when driven by source 154 with the indicated polarity. When no voltage is applied to the bimorph, there is no deflection. When a source 156 is connected between substrate 148 and elements 144 and 146 as shown in FIG. 6, element 146 is driven in its poling direction and bimorph 142 deflects downwardly as indicated.

For some applications, the method of driving a bimorph illustrated in FIG. 6, wherein a deflection voltage is applied in the poling direction of one piezo-ceramic element and opposite to the poling direction of a second piezo-ceramic element is satisfactory. However, where a large amount of deflection is required, large deflection voltages are also required. It has been found that applying large voltages in a direction opposed to the poling direction of a piezo-ceramic element tends to depolarize that element and reduce its ability to bend or deflect.

A method of driving a bimorph with large amplitude deflection voltages without depolarizing either piezo-ceramic element is illustrated in FIG. 7. In the improved method, a bimorph 158 has a pair of electrically poled piezo-ceramic elements 160 and 162 which are also aligned in a common poling direction and bonded to a common substrate 164 between them. The bimorph 158 is cantilevered at one end 166 and is free to deflect at opposed end 168. In this improved method of deflecting a bimorph, deflection voltages are applied to the piezo-ceramic elements such that the polarity of the applied voltage is always in the poling direction of the element to which it is applied so that a large degree of deflection of the bimorph can be effected without depolarizing either of the piezo-ceramic elements.

As shown in FIG. 7, when bimorph 158 is to be deflected upwardly, a voltage source 170 is connected between the piezo-ceramic element 160 and the substrate 164 such that the polarity of the applied voltage is in the poling direction of element 160. No opposed polarity voltage is applied to the element 162 since most of the bending of a bimorph is effected by the element which is driven in its poling direction.

When the bimorph 158 is to be deflected downwardly, a voltage source 172 is connected between the element 162 and the substrate 164 such that the polarity of the applied voltage is in the poling direction of the element 162. No opposed polarity voltage is applied to the element 160.

When bimorph 158 is to remain undeflected, sources 170 and 172 of equal magnitudes are applied between the elements 160 and 162 and the substrate 164 so that both piezo-ceramic elements 160 and 162 are driven in their poling directions. The net result of driving both elements equally is that no deflection takes place.

Although the sources 170 and 172 are depicted as being constant amplitude voltage sources, they need not be. If the bimorph 158 is to be deflected upwardly and downwardly with variable amounts of deflection, sources 170 and 172 could be made variable to accomplish such movement. However, the polarity of the voltages applied to elements 160 and 162 should always be in the poling direction of the element to which the voltage is applied.

A method of varying the magnitude and frequency of the deflection of bimorph 158 is illustrated schematically in FIG. 8a. As shown therein, a DC voltage from a source 174 is applied to the element 160 in its poling direction. The element 162 receives a DC voltage from source 176 which is in its poling direction. Preferably, sources 174 and 176 generate positive and negative DC voltages respectively, of magnitudes equal to $\frac{1}{2} V_{max}$, where $V_{max}$ is the peak to peak amplitude of the largest deflection signal which will be applied to the elements 160 and 162. Elements 160 and 162 are thus oppositely "biased" to $\frac{1}{2} V_{max}$ and, in the absence of any other deflection voltages, no deflection of bimorph 158 will occur.

For effecting alternating deflection of bimorph 158, and AC deflection source 178 is coupled between elements 160, 162 and substrate 164 through a pair of amplifiers 180 and 182 and DC sources 174 and 176. The peak-to-peak magnitude of the AC deflection signal applied in phase to elements 160 and 162 may now be as large as $V_{max}$ without ever applying to either element a net voltage which is opposed to its poling direction.

When the deflection signal from the source 178 varies generally sinusoidally, the net voltage which appears across element 160 is indicated in FIG. 8B. With the elements 160 and 162 oppositely biased at $\frac{1}{2} V_{max}$ and the superimposed AC deflection signal applied in phase to the elements, the net voltage cross each of the elements 160 and 162 always has a polarity which is in the poling direction of elements. The curves labeled "deflection" in FIG. 8b indicate that bimorph 158 deflects in accordance with the two times the instantaneous amplitude of the AC deflection voltage provided by source 178.

When the net voltage on element 160 becomes more (or less) positive about $\frac{1}{2} V_{max}$, the net amplitude of the voltage on element 162 becomes less (or more) negative correspondingly. However, because of the bias provided by source 176, the net voltage on the element 162 will always be in its poling direction as long as the magnitude of the AC deflection voltage does not exceed $V_{max}$.

The system shown in FIG. 8a for driving the bimorph 158 is completely DC coupled so that bimorph 158 can be driven at very low frequencies by the source 178. In applications where low frequency bimorph deflection is not required, a system such as that shown in FIG. 9 may be used. In the system of FIG. 9, only one amplifier 184 is needed for amplifying the AC deflection voltage from source 186. The amplified deflection voltage is applied to elements 160 and 162 via coupling capacitors 186 and 188, respectively. Separate DC bias voltage sources 190 and 192, each having an amplitude of $\frac{1}{2} V_{max}$, bias the elements 160 and 162 so that the net voltage on either element will be in its poling direction.

Referring again to FIG. 8a, the DC source 174 and amplifier 180 are enclosed in a dashed triangle to indicate that, in practice, they may be embodied together in one composite amplifier which amplifies the deflection signal and also provides the proper bias. Similarly, sources 176 and 182 may also be combined in a single composite amplifier. An example of a pair of composite amplifiers for driving a bimorph is shown in FIG. 10. The bimorph which is being driven in FIG. 10 is part of a read transducer assembly 194 for use with the videotape apparatus shown in FIG. 3. Transducer assembly 194 is shown schematically and in simplified form in FIG. 10 but is preferably similar to transducer assembly 36 shown in FIG. 2. (The piezo-ceramic generator 68 is not shown as part of transducer assembly 194 only in order to simplify the drawing.)

The transducer assembly 194 has a top piezo-ceramic layer 196 and a bottom piezo-ceramic layer 198 bonded to a common substrate 200 which is grounded. Deflection signals are applied to the transducer assembly 194 at upper and lower conductive layers 202 and 204. Piezo-ceramic elements 196 and 198 are poled in a common direction as indicated by the arrows.

A read transducer 199 is mounted on assembly 194 and is to be deflected in accordance with the principles and apparatus hereinbefore described. The piezo-ceramic layer 196 is driven by composite amplifier 206 and piezo-ceramic layer 198 is driven by the composite amplifier 208. The amplifiers 206 and 208 receive low level AC deflection signals at input terminal 210, amplify the deflection signals, and apply them superimposed on a DC bias voltage, to conductive layers 202 and 204. Generally, amplifier 206 includes a first stage of amplification provided by differential transistor pair 212 and 214 and a second stage of amplification provided by differential transistor pair 216 and 218. The output of transistor 218 is taken across constant current source transistor 220. The amplified signal at the collector of transistor 218 is applied to the bases of emitter followers 224 and 226 and through emitter resistors 228 and 230 to an output terminal 232. The signal at terminal 232 is fed back to the base of transistor 214 via a feedback resistor 234 so that amplifier 206 operates as a conventional operational amplifier with negative feedback.

The DC bias appearing at output terminal 232 is typically +100 volts and is determined by resistors 236, 238, the feedback resistor 234 and the +200 volt power supply. An AC deflection signal of 200 volts peak to peak can appear at the output terminal 232 without opposing the polarization polarity of piezo-ceramic layer 196. The transistors 240 and 242 provide short circuit protection for emitter followers 224 and 226, respectively, in order to limit their output current in the event that terminal 232 becomes inadvertently grounded. Amplifier 208 is similar to amplifier 206 and provides an amplified deflection signal at its output terminal 244 superimposed on a DC bias of −100 volts. Amplifiers 206 and 208 can be used together to provide the amplification performed by drive amplifier 100 in FIG. 3.

The composite amplifiers 206 and 208 provide large amplitude AC deflection signals superimposed on a DC bias voltage for driving the deflectable bimorph without depolarizing it and thereby ensure that the driven bimorph does not lose its deflection sensitivity. The transducer system shown in FIG. 10 and the methods illustrated in FIGS. 8a and 9 and described herein provide improved performance for deflectable bimorphs.

From the foregoing, it should be appreciated that various improved bimorph devices and methods have been described which, while representing different inventions, have been disclosed together in the environment of an improved videotape read system. The bimorph motor-generator combination, for example, provides a compact, reliable device for sensing the instantaneous deflected position of a deflectable piezo-ceramic support arm. The illustrated embodiment of this device shows it as part of an improved videotape read assembly for generating an output signal indicative of the deflected position of a read transducer. This novel assembly overcomes problems associated with deflectable read assemblies which vibrate when they receive an electrical or mechanical impulse by generating an output signal which can be converted to a damping signal for damping the transducer vibrations.

The damping of transducer vibrations is achieved by the described feedback control system which generates a signal indicative of the velocity of a deflected or vibrating transducer, converts the velocity signal to a damping signal, and applies the damping signal to the transducer support arm to dampen vibrations therein. The improved bimorph motor-generator combination is preferably used in this damping system to generate a signal indicative of instantaneous transducer position, the transducer velocity signal being derived by differentiating the transducer position signal. Various means are included in the damping system for stabilizing the feedback control system at frequencies near the resonant and anti-resonant points of the bimorph-motor-generator. This feedback control system, in combination with the novel bimorph motor-generator transducer assembly, provides effective damping of a deflectable videotape read transducer without restricting the dynamic range of the transducer. Moreover, this electronic damping system is not adversely affected by the high G accelerations normally encountered in videotape read systems.

The damping signals and transducer deflection signals are preferably applied to the bimorph transducer support arm by the method and apparatus described herein which overcomes the depolarizing effects associated with prior methods by ensuring that the applied deflection signals are always in the poling direction of the piezo-ceramic element to which they are applied. A composite amplifier embodying this improved method receives large amplitude transducer deflection signals and applies them to the bimorph so as to achieve large bidirectional bimorph deflection without depolarizing the bimorph, thereby maintaining high bimorph deflection sensitivity.

The above-described improvements have been combined in a new improved videotape read system for use with videotape recorders, and particularly for use with helical videotape recorders. However, the improvements may be used independently of one another and in applications other than videotape read systems. Moreover, many alternatives, modifications and variations in the specific embodiments described herein will be apparent to those skilled in the art. Accordingly, the present invention is intended to include all such alternatives, modifications and variations which fall within the spirit and scope of the invention as defined by the appended claims and equivalents thereof.

Various features of the invention are set forth in the following claims.

What is claimed is:

1. A piezoelectric bimorph and driver therefor, comprising:

a bimorph having a pair of electrically poled piezo-ceramic elements bonded to a common substrate between said elements and aligned in a common poling direction, the bonded pair of elements having a cantilevered end portion and an opposite end portion which is free to deflect; and, means for applying to each piezo-ceramic element a deflection voltage having a polarity which is in the poling direction of the piezo-ceramic element to which it is applied, whereby a large degree of deflection of the bimorph in either direction can be effected without depolarizing either piezo-ceramic element.

2. A piezoelectric bimorph and driver therefor as set forth in claim 1 wherein said deflection voltages include a DC bias voltage applied to each piezo-ceramic element and an AC deflection voltage superimposed on the DC bias voltage for controlling deflection of the bimorph, the polarity of each DC bias voltage being in the poling direction of the element to which it is applied, and the magnitude of each DC bias voltage being large enough so that the net voltage applied to each piezo-ceramic element has a polarity which is in the poling direction of that piezo-ceramic element.

3. A piezoelectric bimorph and driver therefor as set forth in claim 2 wherein substantially equal DC bias voltges are applied between the substrate and each piezo-ceramic element.

4. A piezoelectric bimorph and driver therefor as set forth in claim 3 wherein the AC deflection voltage is applied between the substrate and each of said piezo-ceramic elements.

5. A piezoelectric bimorph and driver therefor comprising:

a bimorph having a pair of electrically poled piezo-ceramic elements aligned in a common poling direction and bonded to a common substrate between said elements, the bonded pair of elements having a cantilevered end and an opposed end which is free to deflect;

means for applying a DC bias voltage between each of said piezo-ceramic elements and said substrate such that the polarity of the applied bias voltage is in the poling direction of the piezo-ceramic element to which it is applied; and means for applying AC deflection voltage between said substrate and each of said piezo-ceramic elements so that the AC deflection voltage is superimposed on the DC bias voltages for controlling the deflection of the bimorph, the magnitudes of the DC bias voltages being large enough so that the net voltage applied to each piezo-ceramic element has a polarity which is in the poling direction of that element.

6. A piezoelectric bimorph and driver therefor as set forth in claim 5 wherein the DC bias voltages applied to the piezo-ceramic elements are of substantially equal magnitudes.

7. A deflectable read transducer system for sensing information along a track of a recording medium comprising:

a piezoelectric bimorph comprising a pair of electrically poled piezo-ceramic elements bonded together and aligned in a common poling direction, the bonded pair of piezo-ceramic elements having a common cantilevered end and a common opposed end which is free to deflect;

a read transducer mounted at the deflectable end of said bimorph for sensing information on a recording medium; and means for applying deflection voltages to each piezo-ceramic element, said deflection voltages having a polarity which is in the poling direction of the piezo-ceramic element to which it is applied, whereby a large degree of deflection of the bimorph can be effected without depolarizing either piezo-ceramic element.

8. A deflectable read transducer system as set forth in claim 7 wherein said deflection voltages include a DC bias voltage applied to each piezo-ceramic element and an AC deflection voltage superimposed on the DC bias voltage for controlling deflection of the bimorph, the magnitudes of the DC bias voltages being so large that the net voltage applied to each piezo-ceramic element has a polarity which is in the poling direction of that element.

9. A deflectable read transducer system as set forth in claim 8 wherein said piezo-ceramic elements are bonded to a common substrate, wherein substantially equal DC bias voltages are applied between the substrate and each piezo-ceramic element, and wherein the AC deflection voltage is applied between the substrate and each of said piezo-ceramic elements.

10. A deflectable read transducer system for sensing information along a track of a recording medium, comprising:

a piezoelectric bimorph having a pair of electrically poled piezo-ceramic elements aligned in a common poling direction and bonded to a common substrate between said piezo-ceramic elements, the bonded pair of elements having a common cantilevered end and a common opposed end which is free to deflect;

a read transducer mounted on the deflectable end of said bimorph for sensing information on a recording medium;

means for applying a DC bias voltage between each of said piezo-ceramic elements and said substrate such that the polarity of the applied bias voltage is in the poling direction of the piezo-ceramic element to which it is applied; and means for applying an AC deflection voltage between said substrate and each of said piezo-ceramic elements so that the AC deflection voltage is superimposed on said DC bias voltage for controlling the deflection of the bimorph, the magnitude of the DC bias voltage being so large that the net voltage applied to each piezo-ceramic element has a polarity which is in the poling direction of that element.

11. A deflectable read transducer system as set forth in claim 10 wherein the DC bias voltages applied to the piezo-ceramic elements are of substantially equal magnitudes.

12. A piezoelectric bimorph and driver for the same, comprising:

a bimorph having a pair of electrically poled piezo-ceramic elements bonded to a common conductive substrate located therebetween, said bimorph being mounted at one end portion and the remainder thereof being free for deflecting movement upon application of deflecting voltage thereto; and means for applying a deflecting voltage between each element and said substrate of such polarity that deflecting movement of said bimorph in either direction can be produced without applying to either element a voltage in a direction tending to depolarize either of said elements.

13. A bimorph and driver as defined in claim 12 wherein said elements are bonded in such a manner that the poling direction of one element is the same as the poling direction of the other element.

14. A method of driving a cantilevered piezo-electric bimorph having a pair of electrically poled piezo-ceramic elements aligned in a common poling direction and bonded to a common substrate between said elements, comprising:

applying deflection voltages to each piezo-ceramic element such that the polarity of the voltage applied to each element is in the poling direction of the element to which it is applied, whereby a large degree of deflection of the bimorph can be effected without depolarizing either piezo-ceramic element.

15. A method as set forth in claim 14 wherein said deflection voltages include a DC bias voltage applied to each piezo-ceramic element and an AC deflection voltage superimposed on the DC bias voltages for controlling deflection of the bimorph, the polarity of each DC bias voltage being in the poling direction of the piezo-ceramic element to which it is applied, and the magnitudes of the DC bias voltages being so large that the net voltage applied to each piezo-ceramic element has a polarity which is in the poling direction of that element.

16. A method as set forth in claim 15, including applying substantially equal DC bias voltages between the substrate and each piezo-ceramic element.

17. A method as set forth in claim 16 wherein the AC deflection voltage is applied between the substrate and each of said piezo-ceramic elements.

* * * * *

UNITED STATES PATENT AND TRADEMARK OFFICE
CERTIFICATE OF CORRECTION

PATENT NO. : 4,106,065
DATED : August 8, 1978
INVENTOR(S) : Raymond F. Ravizza

It is certified that error appears in the above-identified patent and that said Letters Patent are hereby corrected as shown below:

Column 1, line 7, change "," to --.--.

Column 1, line 65, change "application" to --applications--.

Column 2, line 48, change "to" to --of--.

Column 2, line 55, change "aspect" to --aspects--.

Column 4, line 26, change "art" to --arm--.

Column 5, line 40, change "sre" to --are--.

Column 7, line 64, change "copending U.S. application" to --co-pending U.S. applications--.

Column 10, line 27, change "pase" to --phase--.

Column 10, line 50, change "to", second occurrence, to --of--.

Column 14, line 34, change "8B" to --8b--.

Column 16, line 31, after "dynamic" insert --deflectable--.

Column 17, line 44, after "applying" insert --an--.

Column 19, line 5, change "piezo-electric" to --piezoelectric--.

Signed and Sealed this

Second Day of October 1979

[SEAL]

Attest:

RUTH C. MASON
Attesting Officer

LUTRELLE F. PARKER
Acting Commissioner of Patents and Trademarks